United States Patent
Kim et al.

(10) Patent No.: US 10,795,763 B2
(45) Date of Patent: Oct. 6, 2020

(54) MEMORY SYSTEM AND ERROR CORRECTING METHOD THEREOF

(71) Applicant: SK hynix Inc., Gyeonggi-do (KR)

(72) Inventors: Yong-Ju Kim, Seoul (KR); Do-Sun Hong, Gyeonggi-do (KR); Dong-Gun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/203,862

(22) Filed: Nov. 29, 2018

(65) Prior Publication Data

US 2019/0163570 A1    May 30, 2019

(30) Foreign Application Priority Data

Nov. 30, 2017  (KR) .......................... 10-2017-0163395

(51) Int. Cl.
*G11C 29/52* (2006.01)
*G06F 11/10* (2006.01)
*G11C 29/44* (2006.01)
*G11C 29/42* (2006.01)
*H03M 13/15* (2006.01)
*G11C 29/04* (2006.01)

(52) U.S. Cl.
CPC ...... *G06F 11/1068* (2013.01); *G06F 11/1004* (2013.01); *G06F 11/1048* (2013.01); *G11C 29/42* (2013.01); *G11C 29/44* (2013.01); *G11C 29/52* (2013.01); *G11C 2029/0411* (2013.01); *G11C 2029/4402* (2013.01); *H03M 13/1515* (2013.01)

(58) Field of Classification Search
CPC ............. G06F 11/1068; G06F 11/1048; G06F 11/1004; G11C 29/44; G11C 29/52; G11C 29/42; G11C 2029/4402; G11C 2029/0411; H03M 13/1515
USPC .......................................................... 714/764
See application file for complete search history.

(56) References Cited

U.S. PATENT DOCUMENTS

| | | | | |
|---|---|---|---|---|
| 6,044,483 A * | 3/2000 | Chen | ................... | G06F 11/1044 714/48 |
| 2005/0286308 A1 * | 12/2005 | Nagashima | ............ | G11C 16/06 365/185.22 |
| 2006/0136800 A1 * | 6/2006 | Kawabata | ........... | G06F 11/1012 714/763 |

(Continued)

FOREIGN PATENT DOCUMENTS

| KR | 101141487 | 7/2012 |
|---|---|---|
| KR | 1020160124794 | 10/2016 |

*Primary Examiner* — Albert Decady
*Assistant Examiner* — Enam Ahmed
(74) *Attorney, Agent, or Firm* — IP & T Group LLP

(57) ABSTRACT

A memory system includes a plurality of memory chips suitable for storing data and an error correction code thereof, an error correction circuit suitable for detecting and correcting error bits of data, which are read from the plurality of memory chips, based on an error correction code of the read data, an address storage circuit suitable for storing addresses of first data, among the read data, the first data having a number of detected error bits greater than or equal to a first number, and a failed chip detection circuit suitable for, when the number of the stored addresses is greater than or equal to a second number, detecting a failed memory chip where a chip-kill occurs by writing test data in the plurality of memory chips and reading back the written test data.

20 Claims, 4 Drawing Sheets

(56) References Cited

U.S. PATENT DOCUMENTS

| | | | | |
|---|---|---|---|---|
| 2006/0245259 | A1* | 11/2006 | Fukuda | G11C 16/3459 365/185.22 |
| 2009/0132876 | A1* | 5/2009 | Freking | G06F 11/106 714/723 |
| 2010/0162037 | A1* | 6/2010 | Maule | G11C 29/83 714/5.11 |
| 2010/0185897 | A1* | 7/2010 | Abts | G06F 11/106 714/16 |
| 2010/0287445 | A1* | 11/2010 | Dell | G06F 11/1044 714/763 |
| 2015/0278017 | A1* | 10/2015 | Trezise | G11C 5/04 714/764 |
| 2018/0101424 | A1* | 4/2018 | Lim | G06F 3/0619 |
| 2018/0101427 | A1* | 4/2018 | Park | G11C 29/24 |

\* cited by examiner

FIG. 3

| Address | Error Bit Information |
|---|---|
| Address 1 | CE |
| Address 2 | UCE |
| Address 3 | CE |
| Address 4 | UCE |
| . | . |
| . | . |
| . | . |
| Address N | CE |

MEMORY SYSTEM AND ERROR CORRECTING METHOD THEREOF

CROSS-REFERENCE TO RELATED APPLICATION(S)

The present application claims priority of Korean Patent Application No. 10-2017-0163395, filed on Nov. 30, 2017, which is incorporated herein by reference in its entirety.

BACKGROUND

1. Field

Various embodiments of the present invention generally relate to a semiconductor designing technology. Particularly, the embodiments relate to an error correcting method of a memory system.

2. Description of the Related Art

A memory system is used as a main memory device or an auxiliary memory device for various consumer or industrial electronic devices such as a computer, a mobile phone, a Portable Digital Assistant (PDA), a digital camera, a game player, a navigation device, and the like. Memory devices realizing the memory system may include volatile memory devices, such as a Dynamic Random Access Memory (DRAM), a Static Random Access Memory (SRAM) and the like, and non-volatile memory devices, such as a Read Only Memory (ROM), a Mask ROM (MROM), a Programmable ROM (PROM), an Erasable Programmable ROM (EPROM), an Electrically Erasable Programmable ROM (EEPROM), a Ferroelectric RAM (FRAM), a Phase-Change RAM (PRAM), a Magneto-resistive RAM (MRAM), a Resistive RAM (RRAM), a flash memory, and the like.

In the past, the semiconductor memory industry was able to regularly produce memory chips with no defective memory cells through a semiconductor fabrication process. However, as the capacity of the memory device gradually increases, it becomes difficult to fabricate a memory device which is completely free of defective memory cells. Moreover, it is unlikely that such an error-free memory device may fabricated at present.

One way to overcome this problem is to repair or cure defective memory cells in a memory device by replacing them with redundant memory cells. Another way is to use an error correction circuit for correcting errors in the memory system, and more particularly, to correct errors occurring in the memory cells and other errors occurring when data are transferred during a read operation and/or a write operation of the memory system.

SUMMARY

Embodiments of the present invention are directed to a memory system capable of increasing an error correction efficiency, and a method for operating the memory system.

In accordance with an embodiment of the present invention, a memory system includes: a plurality of memory chips suitable for storing data and an error correction code thereof; an error correction circuit suitable for detecting and correcting error bits of data, which are read from the plurality of memory chips, based on an error correction code of the read data; an address storage circuit suitable for storing addresses of first data, among the read data, the first data having a number of detected error bits greater than or equal to a first number; and a failed chip detection circuit suitable for, when the number of the stored addresses is greater than or equal to a second number, detecting a failed memory chip where a chip-kill occurs by writing test data in the plurality of memory chips and reading back the written test data.

In accordance with another embodiment of the present invention, an error correction method of a memory system includes: reading data and an error correction code thereof from a plurality of memory chips; detecting and correcting error bits of the read data based on the read error correction code; storing addresses of first data, among the read data, having the detected error bits of greater than or equal to a first number; and when the number of the stored addresses is greater than or equal to a second number, detecting a failed memory chip where a chip-kill occurs by writing test data in the plurality of memory chips and reading back the written test data.

In accordance with further embodiment of the present invention, a memory system includes: a plurality of memory chips, each including a plurality of memory cells, suitable for storing write data with an error correction code; and a memory controller suitable for detecting and correcting at least one error bit in read data, which is outputted from the plurality of memory chips, based on an error correction code relevant to the read data, storing an address corresponding to the read data when the at least one error bit is detected and corrected, and determining a failed memory chip, among the plurality of memory chips, when the number of stored addresses is greater than a first threshold.

BRIEF DESCRIPTION OF THE DRAWINGS

FIG. 3 presents addresses and error bit information that are stored in an address storage circuit shown in FIG. 2.

DETAILED DESCRIPTION

Figure 1:
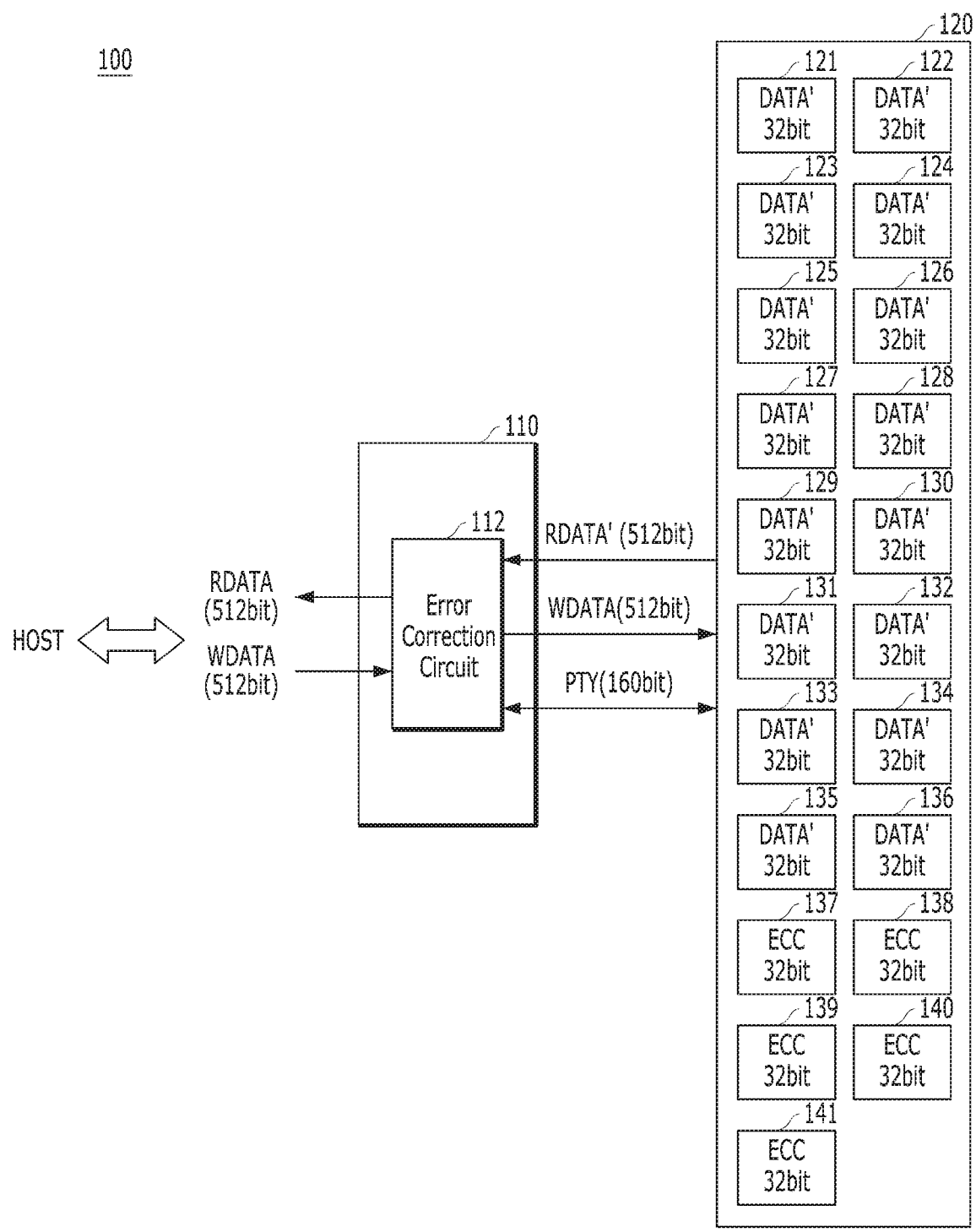
FIG. 1 is a block diagram illustrating a memory system performing an error detection and correction operation.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts in the various figures and embodiments of the present invention. Also, throughout the specification, reference to "an embodiment" or the like is not necessarily to only one embodiment, and different references to "an embodiment" or the like are not necessarily to the same embodiment(s).

Since general memory systems have low error rates, errors that occur randomly in a memory device of a memory system may be processed with an error correction circuit that is mounted on, or associated with, the memory device. An error correction circuit mounted on a memory controller of the memory system may perform a relatively simple form of error correction such as a Single Error Correction/Double Error Detection (SEC/DED) in which a 1-bit error is corrected in consideration of only a chip-kill case and a 2-bit error is detected.

However, since the probability of occurrence of a multi-bit error increases as the memory devices become more highly integrated, a random error may be expected to occur frequently. Therefore, the error correction circuit provided in the memory controller may handle both chip-kill error and random error.

FIG. 1 is a block diagram illustrating a memory system 100 performing an error detection and correction operation. FIG. 1 shows a portion that is directly related to the transfer of data in the memory system 100.

Referring to FIG. 1, the memory system 100 may include a memory controller 110 and the memory module 120. The memory controller 110 may control operations of the memory module 120, such as a read operation and a write operation, in response to a request from the host (HOST).

The memory controller 110 may include an error correction circuit 112. The memory module 120 may include a plurality of memory chips 121 to 141.

The error correction circuit 112 may receive write data WDATA transferred from the host during a write operation and generate an error correction code (ECC), e.g., a parity bit, for detecting and correcting an error based on a predetermined error correction algorithm. The error correction circuit 112 may transfer the generated parity bit(s) PTY to the memory module 120 along with the write data WDATA. For example, the error correction circuit 112 may use an error correction algorithm of the Reed-Solomon (RS) code scheme. In the RS-based error correction algorithm, errors can be corrected on a symbol-by-symbol basis.

The error correction circuit 112 may detect and correct an error included in a read data RDATA' outputted from the memory module 120 by using the parity bit(s) PTY outputted from the memory module 120 during a read operation. The error correction circuit 112 then may deliver the error-corrected read data RDATA to the host. In other words, the error correction circuit 112 may perform an ECC decoding operation on the read data RDATA' outputted from the memory module 120 by using the parity bit(s) PTY generated through the ECC encoding process during a write operation.

When the unit of data processed at once in the memory system 100 is 512 bits, the write data WDATA transferred from the host to the memory controller 110 and the read data RDATA transferred from the memory controller 110 to the host may be a unit of 512 bits. When one symbol processed in the RS algorithm is 8 bits (1 symbol=8 bits), the write data WDATA and the read data RDATA may include 64 symbols.

If the memory system 100 requires an error correction capability capable of correcting [6-bit random error+one chip-killed memory chip], the RS algorithm may correct errors on a symbol-by-symbol basis. Therefore, a total of 10 symbols, which include 6 symbols (on the assumption that a random error of 6 bits belongs to different symbols)+4 symbols (32-bit data error corresponding to one memory chip), should be error-corrected. In the RS algorithm, the number of parity bits (i.e., the size of the error correction code ECC) may be determined according to the number of error-correctable symbols, which is expressed by the following Equation (1).

Equation (1)

The number of parity bits=2*the number of correctable symbols for errors in unknown positions, where the symbol includes M (e.g., 8) bits.

When error correction of 10 symbols is possible based on Equation (1), the size of the parity bit may be=2*10 symbols=20 symbols=20*8 bits=160 bits. That is, the number of parity bits that may be needed to accommodate various situations, up to a situation of [6-bit random error+one chip-killed memory chip] which occurs in the memory chips 121 to 141, may become 160 bits, which is shown in FIG. 1.

Each of the memory chips 121 to 141 may store a 32-bit write data during one write operation and output a 32-bit read data during one read operation (DATA' 32 bits or ECC 32 bits). Therefore, write data WDATA of 512 bits may be written at once or read data RDATA' of 512 bits may be read at once in or from the 16 memory chips 121 to 136. The ECC parity bits PTY (e.g., 160 bits) may be written in, and read from, the five memory chips 137 to 141. In short, the memory module 120 may be configured to include 21 memory chips 121 to 141. FIG. 1 shows information stored in each of the memory chips 121 to 141.

The probability that a memory chip is chip-killed is very low, but since it has to be considered as a possibility, the number of parity bits may be increased more than otherwise necessary. In the above example, when a random error requires 12 symbols, 20 symbols may be required to accommodate the case in which one memory chip is chip-killed. As the number of required parity bits is increased, a memory chip for storing the parity bits is additionally required. This increases the size of an error correction circuit for calculating parity bits and syndromes. Therefore, the area of the memory system may increase, or the ECC decoding latency may be large even in a non-chip-kill situation, thereby reducing the performance of the memory system.

In accordance with an embodiment of the present invention, a method of detecting a position of a failed chip in which a chip-kill occurs and reducing the number of parity bits or increasing the coverage of a random error bit based on the detected position of the failed chip is described below.

Figure 2:
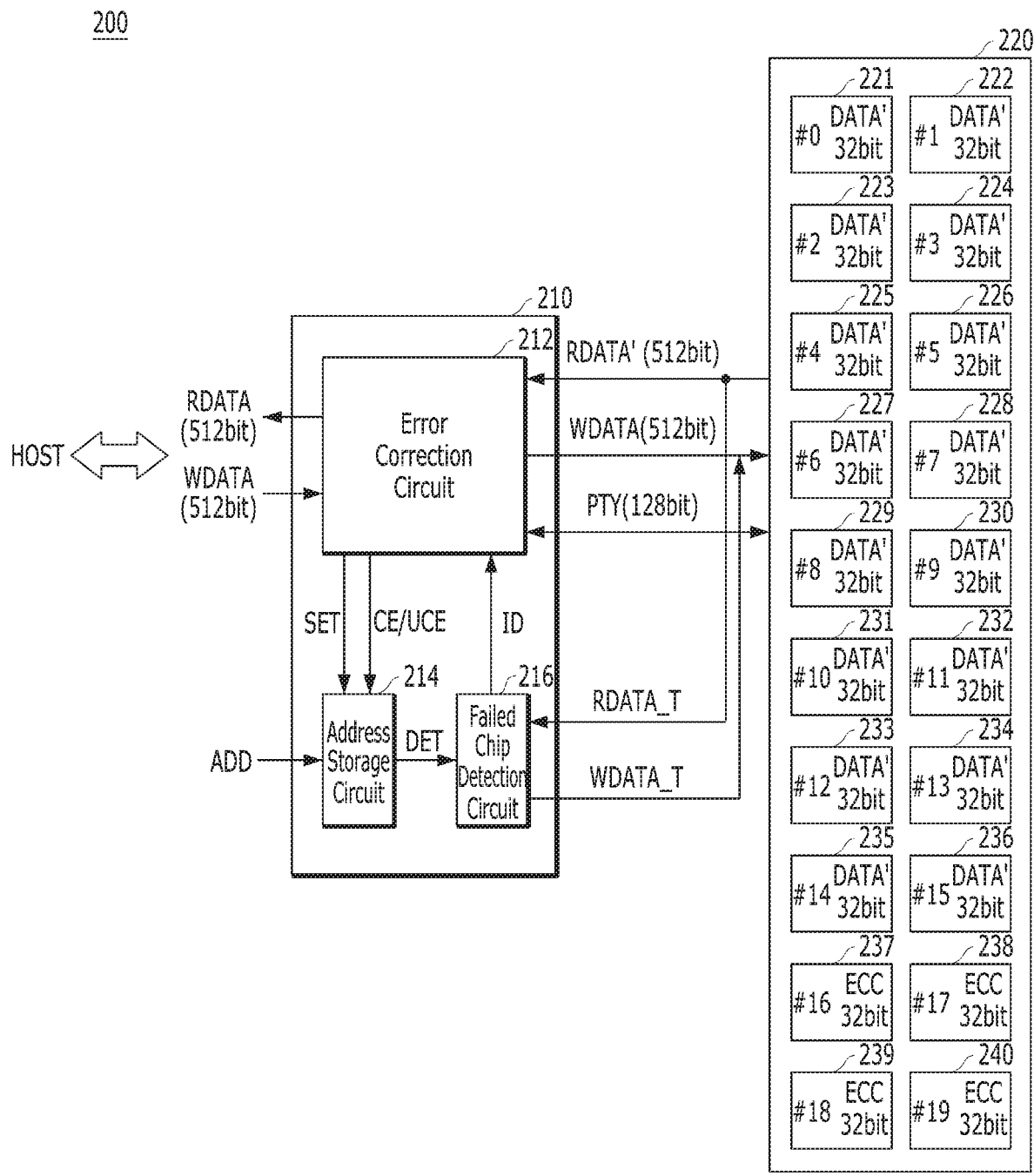
FIG. 2 is a block diagram illustrating a memory system in accordance with an embodiment of the present invention.

FIG. 2 is a block diagram illustrating a memory system 200 in accordance with an embodiment of the present invention.

FIG. 2 shows a portion that is directly related to the transfer of data in the memory system 200.

Referring to FIG. 2, the memory system 200 may include a memory controller 210 and a memory module 220. The memory controller 210 may control operations such as a read operation and a write operation of the memory module 220 in response to a request from the host (HOST).

The memory controller 210 may include an error correction circuit 212, an address storage circuit 214, and a failed chip detection circuit 216. The memory module 220 may include a plurality of memory chips 221 to 240. The memory chips 221 to 240 may be one among various kinds of memories such as a Dynamic Random Access Memory (DRAM), a Phase-Change Random Access Memory (PCRAM), and a flash memory. The memory module 220 may be of a Dual In-Line Memory Module (DIMM) type.

The error correction circuit 212 may receive write data WDATA transferred from the host during a write operation and generate an error correction code ECC (e.g., parity bit(s) PTY) for detecting and correcting an error by using a predetermined error correction algorithm. The error correction circuit 212 may transfer the generated parity bit(s) PTY to the memory module 220 along with the write data WDATA. For example, the error correction circuit 212 may use an error correction algorithm of a Reed-Solomon (RS) code scheme. In the RS-based error correction algorithm, errors may be corrected on a symbol-by-symbol basis.

The error correction circuit 212 may detect, and correct, an error included in read data RDATA' outputted from the memory module 220 by using the parity bit(s) PTY outputted from the memory module 220 during a read operation. Then, the error correction circuit 212 may transfer the error-corrected read data RDATA to the host. In other words, the error correction circuit 212 may perform an ECC decoding operation on the read data RDATA' outputted from the memory module 220 by using the parity bit(s) PTY generated through an ECC encoding process during a write operation.

According to an embodiment of the present invention, the error correction circuit 212 may detect an error of the read data RDATA' and generate a set signal SET. To be specific, the error correction circuit 212 may enable the set signal SET when the number of error bits detected in the read data RDATA' is greater than or equal to a reference value. When the number of detected error bits is less than the reference value, the error correction circuit 212 may disable the set signal SET.

The address storage circuit 214 may store an address of data, among the read data RDATA', having a number of error bits detected by the error correction circuit 212 that is greater than or equal to the reference value. In response to the set signal SET, the address storage circuit 214 may store the address ADD of the read data RDATA' as the address of the data, the number of error bits of which is greater than or equal to the reference value. When the set signal SET is enabled, the address storage circuit 214 may sequentially store the addresses ADD of the read data RDATA' as the addresses of the data having a number of error bits greater than or equal to the reference value. When the set signal SET is disabled, the address storage circuit 214 may sequentially reset the stored addresses. The address storage circuit 214 may generate a detection signal DET and reset the stored addresses when the number of the stored addresses is more than a predetermined number.

When error bits of greater than or equal to the reference value are consecutively detected and then error bits of less than the reference value are detected even once in the read data RDATA', the error correction circuit 212 may disable the set signal SET, and the address storage circuit 214 may reset the stored addresses. Therefore, when the number of consecutive detections in the read data RDATA' of excessive error bits (greater than or equal to the reference value) is more than a predetermined number, the address storage circuit 214 may sequentially store the corresponding addresses to generate a detection signal DET.

When the detection signal DET is inputted from the address storage circuit 214, the failed chip detection circuit 216 may detect a failed chip where chip-kill has occurred by writing a test data WDATA_T into the memory chips 221 to 240 and reading back the written data. The failed chip detection circuit 216 may provide the error correction circuit 212 with the address, i.e., the ID, of the failed chip. The test data WDATA_T may have a data pattern of all-zeros or all-ones. Therefore, the failed chip detection circuit 216 may be able to detect a failed chip by inputting an all-zero pattern or an all-one pattern into the memory chips 221 to 240, reading back the all-zero pattern or the all-one pattern, and comparing the read data RDATA_T with the inputted data WDATA_T. In other words, the failed chip detection circuit 216 may detect or identify a memory chip having a difference between the test data WDATA_T and the read data (RDATA_T) as a failed chip.

Furthermore, when a failed chip in which a chip-kill has occurred is detected, the error correction circuit 212 may correct an error of data in which the error bits detected in the read data RDATA' exceeds the correctable number. The number of error bits used as a reference for the error correction circuit 212 to enable or disable the set signal SET is less than the maximum number of error bits that the error correction circuit 212 may correct. Therefore, data, the addresses of which are stored by the address storage circuit 214, may include data having a number of error bits greater than or equal to the reference value and less than the correctable number, and data having a number of error bits exceeding the correctable number. The error correction circuit 212 may generate information CE/UCE representing which error bit of the corresponding data is detected along with the set signal SET. The error correction circuit 212 may provide the address storage circuit 214 with the information CE/UCE.

FIG. 3 presents addresses ADDRESS_1 to ADDRESS_N and error bit information UCE, CE that are stored in the address storage circuit 214 shown in FIG. 2. The error bit information UCE, CE may be provided from the error correction circuit 212. The error bit information UCE, CE may represent an unfixable error bit and a fixable error bit, respectively.

Referring to FIG. 3, it may be seen that error bits of greater than or equal to the reference value are detected in the read data RDATA' corresponding to the first to $N^{th}$ consecutive addresses ADDRESS_1 to ADDRESS_N. The second and fourth addresses ADDRESS_2, ADDRESS_4 may correspond to the unfixable error bit information UCE and represent that error bits exceeding the correctable number are detected by the error correction circuit 212 in the corresponding data.

When a failed chip identification (ID) is inputted, the error correction circuit 212 may read data, error bits of which detected based on the addresses and error bit information stored in the address storage circuit 214 exceed the correctable number, from the memory chips 221 to 240. Referring to the example of FIG. 3, the error correction circuit 212 may read the data of the second and fourth addresses ADDRESS_2, ADDRESS_4. The error correction circuit 212 may read the corresponding error correction code along with the data and correct the error occurring in the data based on the failed chip ID. The error correction circuit 212 then may transfer the error-corrected data as the read data RDATA to the host. The error correction circuit 212 may complete the read operation.

When the unit of the data processed at once in the memory system 200 is 512 bits, the write data WDATA transferred from the host to the memory controller 210, and the read data RDATA transferred from the memory controller 210 to the host, may be a 512 bit unit. In this case, when one symbol to be processed by the RS algorithm is 8 bits (1 symbol=8 bits), the write data WDATA and the read data RDATA may include 64 symbols, individually.

As described above, if the memory system 200 requires an error correction capability of correcting [a 6-bit random error+one chip-killed memory chip], the number of the parity bits should be 20 symbols (which are 160 bits). However, if the memory chip where the chip-kill has occurred among the memory chips 221 to 240 is known, that is, if the position of the chip-kill is known, the number of the parity bits may be decreased. When an error with a known position and an error with an unknown position are mixed together, the number of the parity bits (that is, the size of the error correction code (ECC)) may be determined based on the following Equation (2).

Equation (2)

The number of parity bits=2*the number of correctable symbols for error in unknown position+the number of correctable symbols for error in known position, where the symbol includes M (e.g., 8) bits.

To calculate the number of the parity bits for correcting the [6-bit random error+error of a failed chip] based on Equation (2), the number of the parity bits=2*6 symbols+4 symbols=16 symbols=128 bits. In short, as illustrated in FIG. 2, the error correction circuit 212 may generate a 128-bit parity PTY and transfer the 128-bit parity PTY to the memory module 220 to correct the 6-bit random error and one chip-killed memory chip, the position of which is known.

Each of the memory chips 221 to 240 may store 32-bit write data in one write operation and output 32-bit read data in one read operation (DATA' 32 bits or ECC 32 bits). Therefore, 512 bits of write data WDATA may be written into the 16 memory chips 221 to 236 at once. Alternatively, 512 bits of read data DATA' may be read once. The ECC parity PTY of 128 bits may be written and read only with the four memory chips 237 to 240.

FIG. 2 shows information stored in each of the memory chips 221 to 240. Also, the numbers for identifying the memory chips 221 to 240 are included. However, the pattern or the format constituting the write data WDATA, the read data RDATA', and the parity bit(s) PTY, which are distributed into the memory chips 221 to 240, does not necessarily have to be the same as shown in FIG. 2. The write data WDATA, the read data RDATA' and the parity bit(s) PTY may be distributed and stored in the memory chips 221 to 240.

Also, although FIG. 2 exemplarily illustrates that the error correction circuit 212, the address storage circuit 214 and the failed chip detection circuit 216 are included in the memory controller 210, any or all of them may be embodied in the memory module 220. The number of the memory modules 220 may be different from the number shown in FIG. 2. Further, the number of the bits of the write data WDATA, the read data RDATA', and the parity (PTY) may be different from those shown in FIG. 2.

As described above, the memory system 200 in accordance with an embodiment of the present invention may detect and correct errors of data by using the parity PTY, the number of bits of which is less than that of a reference value of the memory system 100 of FIG. 1. To this end, a failed chip in which a chip-kill occurs may be detected and coverage of random error bits in the memory system 200 may be increased.

Furthermore, in order to prevent the degradation of performance caused by the detection operation, the occurrence of a failed chip may be predicted, and the detection operation may be minimized under a predetermined standard. Once the failed chip is detected, the memory system 200 may further correct errors in the data that are not error-corrected based on the detected information.

Figure 4:
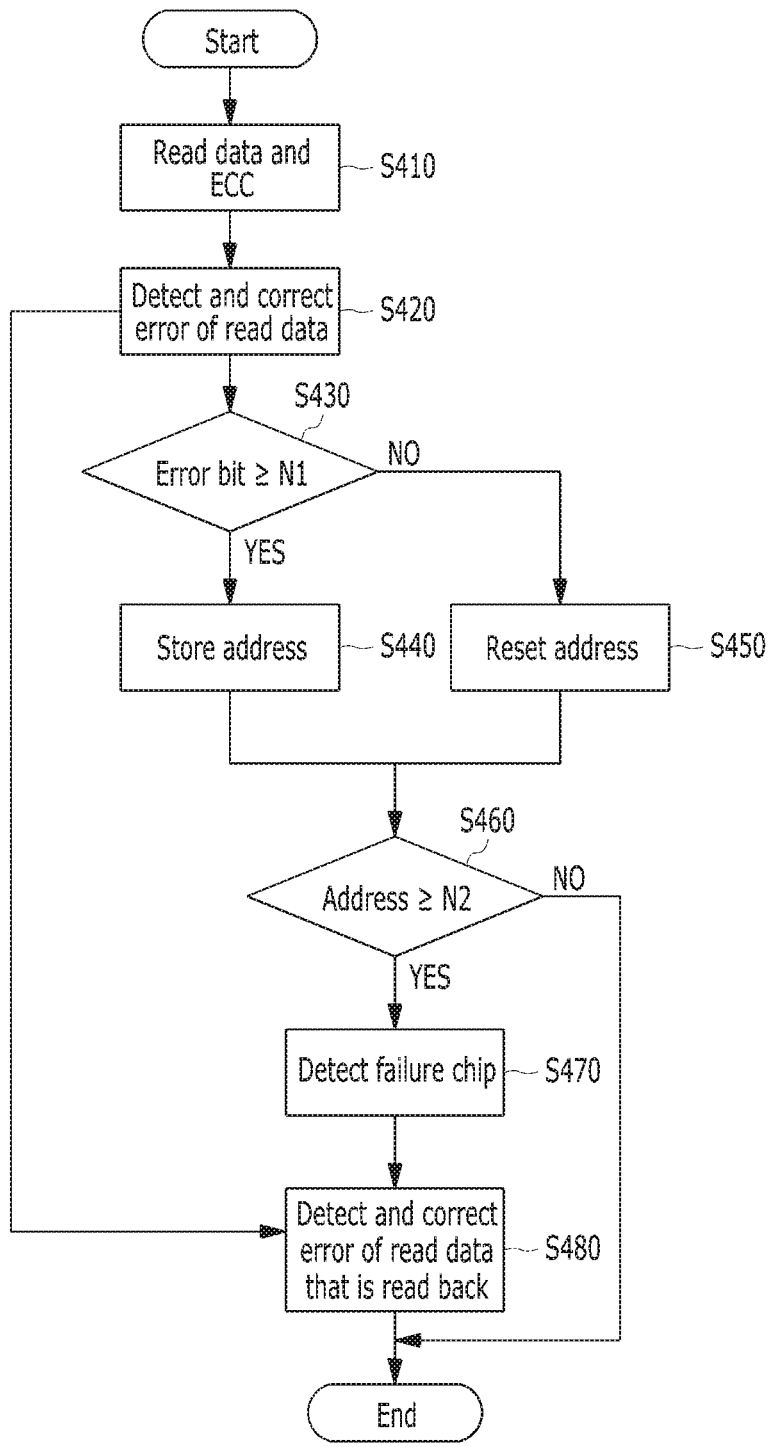
FIG. 4 is a flowchart describing an error correction method of a memory system in accordance with an embodiment of the present invention.

FIG. 4 is a flowchart describing an error correction method of the memory system 200 in accordance with an embodiment of the present invention. Operation of the memory system in accordance with an embodiment of the present invention will be described with reference to FIGS. 2 to 4.

Referring to FIG. 4, the read data RDATA' and the error correction code, that is, the parity bits PTY, may be read from the memory chips 221 to 240 in step S410. The read data DATA' and the parity bits PTY may be transferred to the memory controller 210.

The error correction circuit 212 may detect and correct the error of the read data RDATA' by using the parity bits PTY in step S420. In particular, the error correction circuit 212 may enable or disable the set signal SET based on whether the number of the detected error bits of the read data RDATA' is greater than or equal to a first number N1 or less than the first number N1.

When the number of the error bits detected by the error correction circuit 212 is greater than or equal to the first number N1 (YES in step S430), the address storage circuit 214 may store the address ADD of the read data RDATA' in step S440. That is, when the set signal SET is enabled by the error correction circuit 212, the address storage circuit 214 may sequentially store the addresses ADD of the read data RDATA'.

When the number of the error bits detected by the error correction circuit 212 is less than the first number N1 (NO in step S430), the address storage circuit 214 may reset the sequentially stored addresses ADD in step S450. That is, when the set signal SET is disabled by the error correction circuit 212, the address storage circuit 214 may reset the sequentially stored addresses ADD.

If the number of the addresses ADD stored in the address storage circuit 214 is greater than or equal to a second number N2 (YES in step S460), the failed chip detection circuit 216 may detect a failed chip where a chip-kill has occurred among the memory chips 221 to 240 in step S470. To be specific, when the number of the stored addresses ADD is greater than or equal to the second number N2, the address storage circuit 214 may generate a detection signal DET. The failed chip detection circuit 216 may write the test data WDATA_T into the memory chips 221 to 240 and read back the written data in response to the detection signal DET. The failed chip detection circuit 216 may compare the test data WDATA_T with the data RDATA_T that is read back and detect a memory chip whose test data WDATA_T and data RDATA_T that is read back are different as a failed chip.

According to an embodiment of the present invention, in the step S420 of detecting and correcting the error of the read data RDATA', the error correction circuit 212 may generate error bit information (CE/UCE) that represents data having a number of detected error bits that exceeds the correctable number. When a failed chip is detected by the failed chip detection circuit 216, the error correction circuit 212 may be able to read back such data based on the error bit information (CE/UCE). The error correction circuit 212 may be able to detect and correct the error of the read data based on the address (ID) of the failed chip in step S480. The method in the illustrated embodiment then ends.

According to embodiments of the present invention, since it is possible to detect a position of a failed chip where a chip-kill occurs, a random error bit coverage after the chip-kill may be increased in a is memory system. In other words, since the memory system may reduce the number of parity bits while having the same error correction capability, the size of the error correction circuit and the ECC decoding latency may be reduced.

In addition, a memory system may set a detection criterion and estimate an occurrence of a failed chip on the set section criterion. The memory system may perform a detection operation at a minimum, thereby avoiding deteriorating the performance due to the detection operation.

While the present invention has been described with respect to specific embodiments, it will be apparent to those skilled in the art, in light of the present disclosure, that various changes and modifications may be made without departing from the spirit and scope of the invention as defined in the following claims.

What is claimed is:

1. A memory system, comprising:
    a plurality of memory chips suitable for storing data and an error correction code thereof;
    an error correction circuit suitable for detecting and correcting error bits of data, which are read from the plurality of memory chips, based on an error correction code of the read data;
    an address storage circuit suitable for storing addresses of first consecutive data, among the read data, the first consecutive data having a number of detected error bits greater than or equal to a first number; and
    a failed chip detection circuit suitable for, when the number of the stored addresses of the first consecutive data is greater than or equal to a second number, detecting a failed memory chip where a chip-kill occurs by writing test data in the plurality of memory chips and reading back the written test data.

2. The memory system of claim 1, wherein the error correction circuit generates a set signal by detecting the error bits of the read data, and the error correction circuit enables or disables the set signal based on whether the number of the detected error bits is greater than or equal to the first number or less than the first number.

3. The memory system of claim 2, wherein when the set signal is enabled, the address storage circuit sequentially stores addresses of the read data as the addresses of the first consecutive data, and
    when the set signal is disabled, the address storage circuit resets the addresses of the first consecutive data that are sequentially stored.

4. The memory system of claim 1, wherein when the number of the addresses of the first consecutive data that are sequentially stored by the address storage circuit is greater than or equal to the second number, the address storage circuit generates a detection signal.

5. The memory system of claim 4, wherein the failed chip detection circuit writes the test data in the plurality of memory chips, reads back the written test data, and compares the read-back test data with the test data in response to the detection signal.

6. The memory system of claim 5, wherein the failed chip detection circuit outputs to the error correction circuit an address of a memory chip, of the plurality of memory chips, in which the read-back test data and the test data are different as an address of the failed memory chip.

7. The memory system of claim 1, wherein the error correction circuit generates error bit information that represents second data, among the first consecutive data, having the detected error bits of greater than or equal to a correctable number.

8. The memory system of claim 7, wherein the error correction circuit reads the second data from the plurality of memory chips and corrects error bits of the second data based on an address of the failed memory chip and the error bit information.

9. The memory system of claim 1, further comprising:
    a memory controller including the error correction circuit, the address storage circuit, and the failed chip detection circuit; and
    a memory module including the plurality of memory chips.

10. The memory system of claim 1, wherein a pattern of the test data includes an all-zero data pattern or an all-one data pattern.

11. The memory system of claim 1, wherein the error correction code includes an error correction code of a Reed-Solomon (RS) scheme.

12. An error correction method of a memory system, comprising:
    reading data and an error correction code thereof from a plurality of memory chips;
    detecting and correcting error bits of the read data based on the read error correction code;
    storing addresses of first consecutive data, among the read data, having the detected error bits of greater than or equal to a first number; and
    when the number of the stored addresses of the first consecutive data, is greater than or equal to a second number, detecting a failed memory chip where a chip-kill occurs by writing test data in the plurality of memory chips and reading back the written test data.

13. The error correction method of claim 12, wherein the detecting and correcting of the error bits of the read data includes:
    enabling a set signal when the number of the detected error bits is greater than or equal to the first number; and
    disabling the set signal when the number of the detected error bits is less than the first number.

14. The error correction method of claim 13, wherein the storing of the addresses of the first consecutive data includes:
    sequentially storing addresses of the read data as the addresses of the first consecutive data when the set signal is enabled; and
    resetting the addresses of the first consecutive data that are sequentially stored when the set signal is disabled.

15. The error correction method of claim 12, wherein the detecting of the failed memory chip includes:
    generating a detection signal when the number of the addresses of the first consecutive data that are sequentially stored is greater than or equal to the second number;
    writing the test data in the plurality of memory chips and reading back the written test data in response to the detection signal; and
    comparing the read-back test data with the test data so as to produce a comparison result.

16. The error correction method of claim 15, wherein the detecting of the failed memory chip further includes:
    detecting an address of a memory chip, of the plurality of memory chips, in which the read-back test data and the test data are different as an address of the failed memory chip based on the comparison result.

17. The error correction method of claim 12, wherein the detecting and correcting of the error bits of the read data includes:
    generating error bit information that represents second data, among the first consecutive data, having the detected error bits of greater than or equal to a correctable number.

18. The error correction method of claim 17, further comprising, when the failed memory chip is detected:
    reading the second data from the plurality of memory chips based on the error bit information; and
    detecting and correcting error bits of the read second data based on an address of the failed memory chip.

19. A memory system, comprising:
    a plurality of memory chips, each including a plurality of memory cells, suitable for storing write data with an error correction code; and a memory controller suitable for detecting and correcting at least one error bit in read data, which is outputted from the plurality of memory chips, based on an error correction code relevant to the read data, storing addresses corresponding to consecutive data of the read data when the at least one error bit is detected and corrected for the consecutive data, and determining a failed memory chip where a chip-kill occurs by writing test data in the plurality of memory chips and reading back the written test data, when the number of stored addresses of the consecutive data is greater than a first threshold.

20. The memory system claim 19, wherein the memory controller stores the addresses corresponding to the consecutive data of the read data when the number of detected error bits of the consecutive data is greater than a second threshold.

* * * * *